(12) United States Patent
Su

(10) Patent No.: US 9,786,589 B2
(45) Date of Patent: Oct. 10, 2017

(54) METHOD FOR MANUFACTURING PACKAGE STRUCTURE

(71) Applicants: HongQiSheng Precision Electronics (QinHuangDao) Co., Ltd., Qinhuangdao (CN); FuKui Precision Component (Shenzhen) Co., Ltd., Shenzhen (CN); Zhen Ding Technology Co., Ltd., Tayuan, Taoyuan (TW)

(72) Inventor: Wei-Shuo Su, New Taipei (TW)

(73) Assignees: Qi Ding Technology Qinhuangdao Co., Ltd., Qinhuangdao (CN); Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 14/857,020

(22) Filed: Sep. 17, 2015

(65) Prior Publication Data

US 2016/0181181 A1 Jun. 23, 2016

(30) Foreign Application Priority Data

Dec. 19, 2014 (CN) .......................... 2014 1 0791267

(51) Int. Cl.
*H01L 23/498* (2006.01)
*H01L 21/48* (2006.01)
(Continued)

(52) U.S. Cl.
CPC ...... *H01L 23/4985* (2013.01); *H01L 21/4857* (2013.01); *H01L 23/49822* (2013.01); *H01L 41/0475* (2013.01); *H01L 21/486* (2013.01); *H01L 23/49827* (2013.01); *H01L 23/49866* (2013.01); *H01L 23/49894* (2013.01); *H01L 24/13* (2013.01); *H01L 24/16* (2013.01); *H01L 24/32* (2013.01); *H01L 24/73* (2013.01); *H01L 24/81* (2013.01); *H01L 24/92* (2013.01); *H01L 2224/0401* (2013.01); *H01L 2224/131* (2013.01); *H01L 2224/16227* (2013.01);
(Continued)

(58) Field of Classification Search
CPC ............. H01L 21/4857; H01L 23/4985; H01L 23/49855; H01L 29/7242; H01L 41/0475; H01L 31/03926
See application file for complete search history.

(56) References Cited

U.S. PATENT DOCUMENTS

2014/0300009 A1* 10/2014 Hsu ........................ H01L 23/49
257/784

* cited by examiner

*Primary Examiner* — Thanhha Pham
(74) *Attorney, Agent, or Firm* — Steven Reiss

(57) ABSTRACT

A method for manufacturing a package structure carries out in following way. A flexible circuit board is provided. The flexible circuit board defines a bent area and a laminated area. The flexible circuit board includes a first dielectric layer, a first conductive pattern and a bearing layer located at opposite sides. The bearing layer corresponds to the laminated area. A second dielectric layer and a second conductive pattern are formed on the first conductive pattern. A third dielectric layer and a third conductive pattern are formed on the bearing layer. All of the second and third dielectric layers, and the second and third conductive pattern corresponds to the laminated area. A first solder resist layer is formed on the second conductive layer. The first solder resist layer defines a plurality of openings, a portion of the second conductive pattern is exposed from the openings defining a plurality of first pads.

8 Claims, 21 Drawing Sheets

(51) Int. Cl.
*H01L 41/047* (2006.01)
*H01L 23/00* (2006.01)
(52) U.S. Cl.
CPC ............... *H01L 2224/16237* (2013.01); *H01L 2224/32225* (2013.01); *H01L 2224/73204* (2013.01); *H01L 2224/81192* (2013.01); *H01L 2224/92125* (2013.01); *H01L 2924/1431* (2013.01); *H01L 2924/1434* (2013.01); *H01L 2924/15311* (2013.01); *H01L 2924/15313* (2013.01)

METHOD FOR MANUFACTURING PACKAGE STRUCTURE

FIELD

The subject matter herein generally relates to a package structure and a method for manufacturing a package structure.

BACKGROUND

A package structure includes a package substrate and a chip packaged on the package substrate. The package substrate includes a package surface and an electrical connection surface opposite to the package surface. The chip is packaged on the package surface. The electrical connection surface includes a plurality of electrical contact pads. The electrical contact pads electrically connect the package structure and an external device.

BRIEF DESCRIPTION OF THE DRAWINGS

Implementations of the present technology will now be described, by way of example only, with reference to the attached figures.

DETAILED DESCRIPTION

Figure 1:
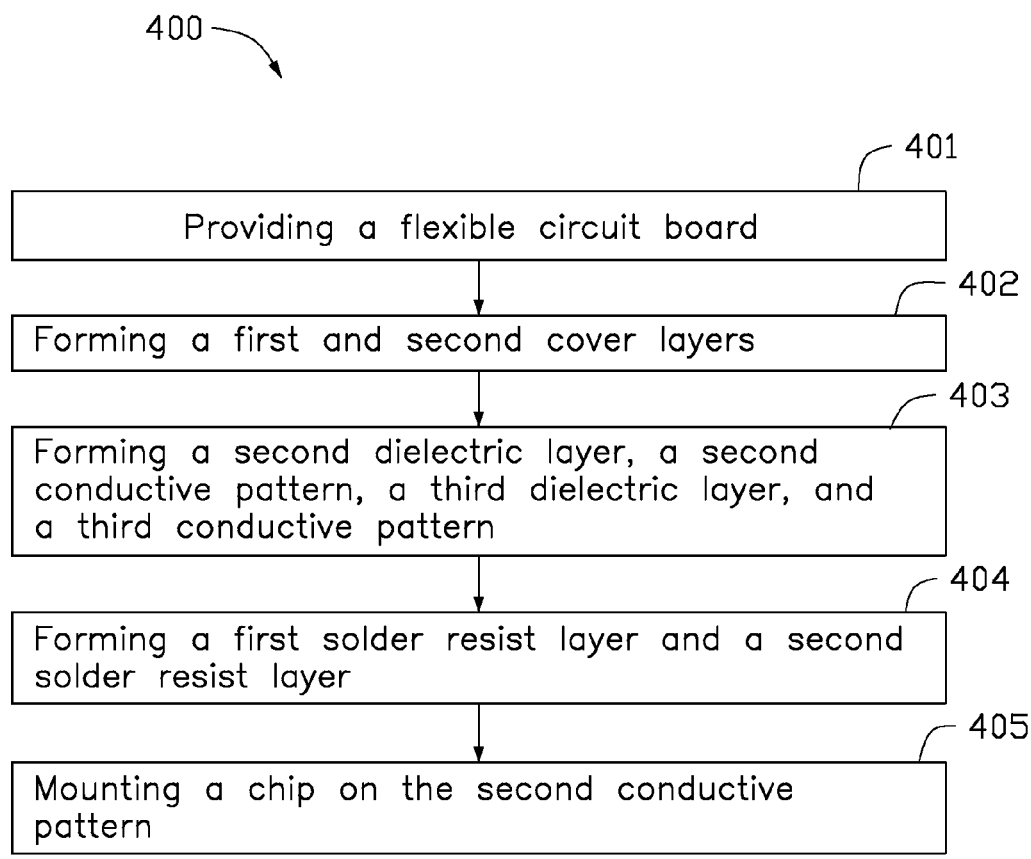
FIG. 1 is a flow chart of an embodiment of a method for manufacturing a package structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a method for manufacturing a package structure comprising: providing a flexible circuit board, defining a bent area and a laminated area, and comprising a first dielectric layer, a first conductive pattern, and a bearing layer, wherein the first conductive pattern and the bearing layer are located at opposite sides of the first dielectric layer, the first conductive pattern comprises a connection terminal located at an end of the bent area away from the laminated area, the bearing layer corresponds to the laminated area; forming a second dielectric layer and a second conductive pattern on the first conductive pattern, and forming a third dielectric layer and a third conductive pattern on the bearing layer, wherein a plurality of first conductive holes are defined in the second dielectric layer, the second conductive pattern and the first conductive pattern are electrically connected with each other via the first conductive holes, a plurality of second conductive holes are defined in the third dielectric layer, the second conductive holes are separated from the bearing layer, the third conductive pattern and the first conductive pattern are electrically connected with each other via the second conductive holes, the second and third dielectric layers, the second and third conductive patterns correspond to the laminated area respectively; and forming a first solder resist layer on the second conductive layer, wherein the first solder resist layer defines a plurality of openings, a portion of the second conductive pattern is exposed from the openings defining a plurality of first pads.

FIG. 1 illustrates a flowchart of an example method 400 presented in accordance with an example embodiment. The example method 400 for manufacturing a package structure (shown in FIG. 19) is provided by way of an example, as there are a variety of ways to carry out the method. Each block shown in FIG. 1 represents one or more processes, methods, or subroutines, carried out in the exemplary method 400. Additionally, the illustrated order of blocks is by example only and the order of the blocks can change. The exemplary method 400 can begin at block 401.

At block 401, providing a flexible circuit board 10.

Figure 2:
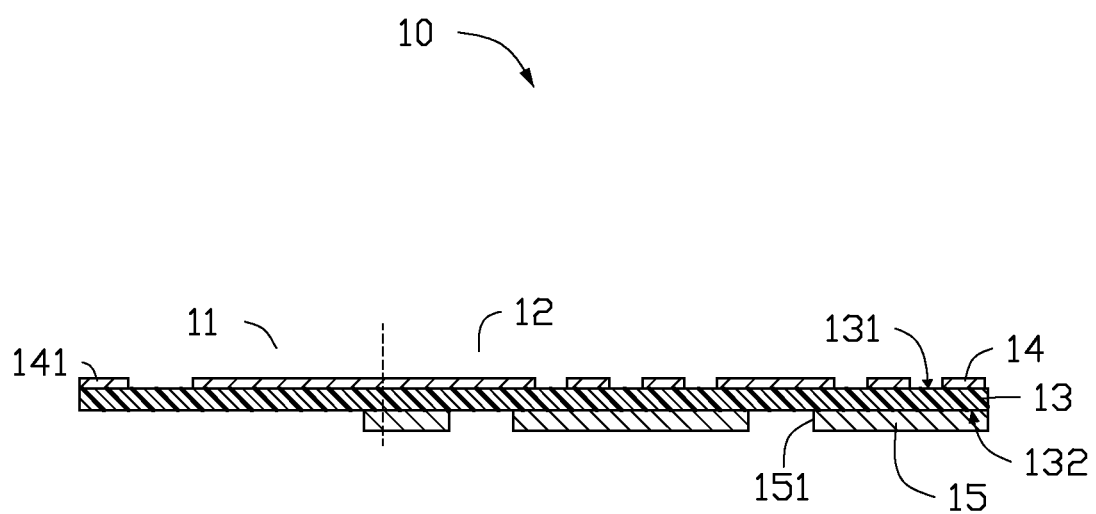
FIGS. 2-20 each are a cross-sectional view of an embodiment of a manufacture process of a package structure.

FIG. 2 illustrates that the flexible circuit board 10 defines a bent area 11 and a laminated area 12. The laminated area 12 connects with the bent area 11. The flexible circuit board 10 includes a first dielectric layer 13, a first conductive pattern 14, and a bearing layer 15 stacked along a thickness direction. The first conductive pattern 14 and the bearing layer 15 are located at opposite sides of the first dielectric layer 13. The first dielectric layer 13 includes a first surface 131 and a second surface 132. The first and second surfaces 131 and 132 are opposite to each other. The first conductive pattern 14 is located at the first surface 131. The first conductive pattern 14 includes a connection terminal 141. The connection terminal 141 is located at an end of the bent area 11 away from the laminated area 12. The connection terminal 141 is configured to electrically connect with a first external device 200. The bearing layer 15 is located at the second surface 132. The bearing layer 15 corresponds to the laminated area 12. A portion of the bearing layer 15 extends to the bent area 11. The bearing layer 15 is configured to provide rigid support. The bearing layer 15 defines a plurality of first openings 151. A portion of the first dielectric layer 13 is exposed from the first openings 151.

In at least one embodiment, the flexible circuit board 10 can be obtained in the following way.

Figure 3:
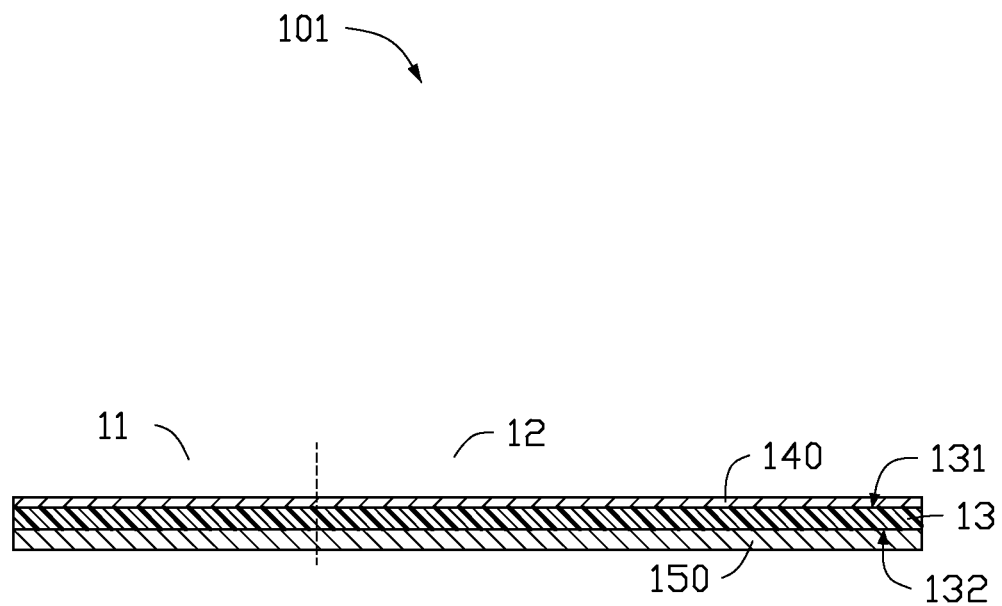

A flexible substrate 101 is provided. FIG. 3 illustrates that the flexible substrate 101 defines a bent area 11 and a laminated area 12. In at least one embodiment, the flexible substrate 101 is a double-sided substrate. The flexible substrate 101 includes a first dielectric layer 13, a first copper layer 140, and an original bearing layer 150. The first dielectric layer 13 is made of insulating materials with certain flexibility, such as polyimide and polyester. The first dielectric layer 13 includes a first surface 131 and a second surface 132 opposite to the first surface 131. The first copper layer 140 is located at the first surface 131. The original bearing layer 150 is located at the second surface 132. A thickness of the original bearing layer 150 is greater than a thickness of the first copper layer.

The first conductive pattern 14 and the bearing layer 15 are formed by selectively removing the first copper layer 140 and the original bearing layer 150 respectively via image transferring and etching process. The original bearing layer 150 corresponding to the bent area 11 is removed, and a plurality of first openings 151 are defined in the original bearing layer 150 corresponding to the laminated area 12.

In another embodiment, the flexible circuit board 10 can be obtained in following way.

Figure 4:
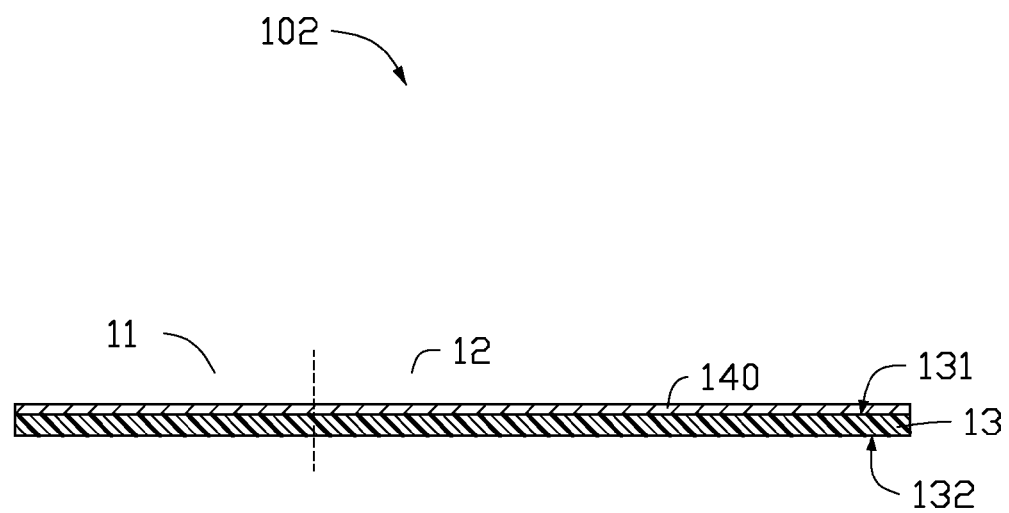

Referring to FIGS. 3 and 4, a flexible substrate 102 is provided. The flexible substrate 102 defines a bent area 11 and a laminated area 12. In at least one embodiment, the flexible substrate 102 is a single-sided substrate. The flexible substrate 102 includes a first dielectric layer 13 and a first copper layer 140. The first dielectric layer 13 is made of flexible insulating materials, such as polyimide and polyester. The first dielectric layer 13 includes a first surface 131 and a second surface 132 opposite to the first surface 131. The first copper layer 140 is located at the first surface 131.

Figure 5:
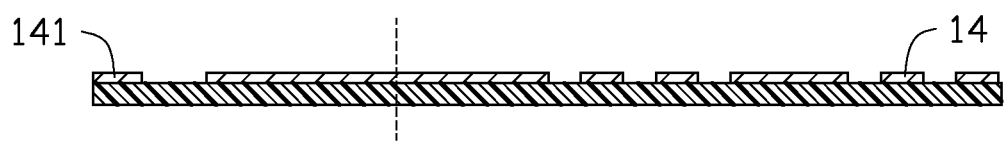

Referring to FIGS. 4 and 5, a first conductive pattern 14 is formed by treating the first copper layer 140 via image transferring and etching process.

Figure 6:

FIG. 6 illustrates that a bearing layer 15 is provided. The bearing layer 15 defines a plurality of first openings 151. The shape and size of the bearing layer 15 correspond to the shape and size of the laminated area 12.

FIG. 2 illustrates that the bearing layer 15 is laminated on the second surface 132 and corresponds to the laminated area 12.

At block 402, forming first and second cover layers 16 and 17.

Figure 7:
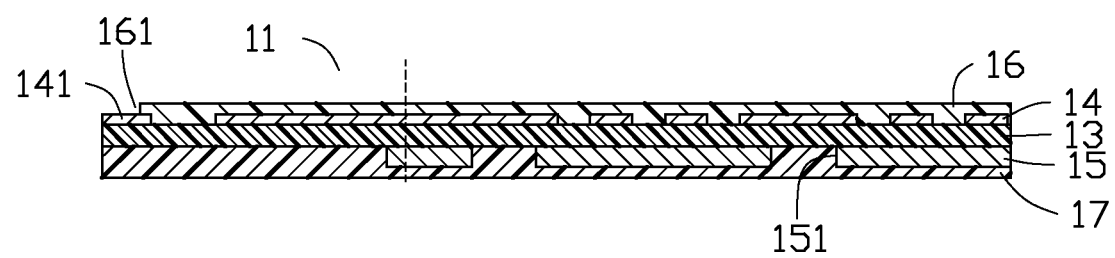

FIG. 7 illustrates that the first cover layer 16 is formed on the first conductive pattern 14. The first cover layer 16 covers the first conductive pattern 14 and the first dielectric layer 13 exposed from the first conductive pattern 14. The first cover layer 16 defines a plurality of second openings 161. The connection terminal 141 is exposed from the second openings 161. The second cover layer 17 is formed on the bearing layer 15. The second cover layer 17 covers the bearing layer 15, the first dielectric layer 13 exposed from the first openings 151, and the first dielectric layer 13 corresponding to the bent area 11. The first and second cover layers 16 and 17 are configured to protect the first conductive pattern 14, the dielectric layer 13, and the bearing layer 15 respectively. In other embodiments, the block 402 can be omitted.

At block 403, forming a second dielectric layer 21, a second conductive pattern 22, a third dielectric layer 31, and a third conductive pattern 32.

Figure 8:
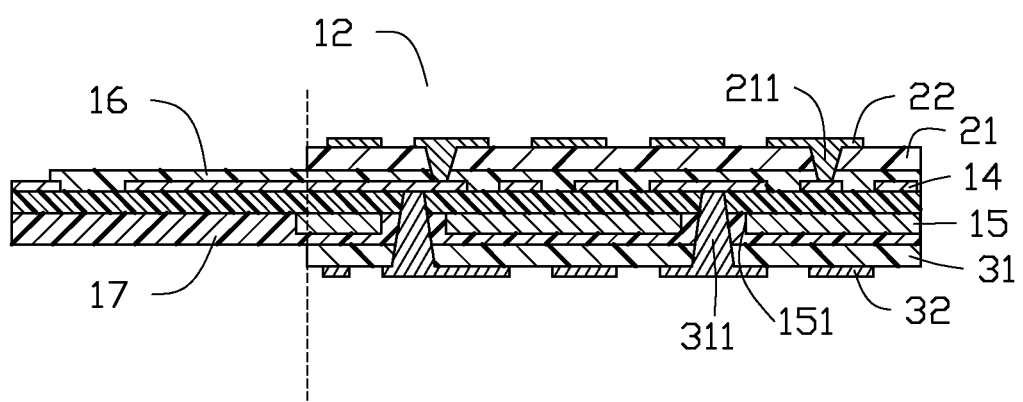

FIG. 8 illustrates that the second dielectric layer 21 is formed on the first cover layer 16. The second conductive pattern 22 is formed on the second dielectric layer 21. That is, the second dielectric layer 21 is located between the first cover layer 16 and the second conductive pattern 22. A plurality of first conductive holes 211 are defined in the second dielectric layer 21 to electrically connect the first conductive pattern 14 and the second conductive pattern 22. The third dielectric layer 31 is formed on the second cover layer 17. The third conductive pattern 32 is formed on the third dielectric layer 31. That is, the third dielectric layer 31 is located between the second cover layer 17 and the third conductive pattern 32. A plurality of second conductive holes 311 is defined to electrically connect the third conductive pattern 32 and the first conductive pattern 14. The second and third dielectric layers 21, 31 can be made of flexible insulating materials such as polyimide and polyester, or be made of rigid insulating materials such as phenol-formaldehyde resin, epoxy resin, and fiber glass. The second dielectric layer 21, the second conductive pattern 22, the third dielectric layer 31, and the third conductive pattern 32 correspond to the laminated area 12 respectively. The second conductive holes 311 run through the third dielectric layer 31, the second cover layer 17, and the first dielectric layer 13. The second conductive holes 311 correspond to the first openings 151 respectively. Each second conductive hole 311 runs through a corresponding first opening 151 and is separated from the bearing layer 15 by the second cover layer 17.

In at least one embodiment, the second dielectric layer 21, the second conductive pattern 22, the third dielectric layer 31, and the third conductive pattern 32 can be obtained in the following way.

Figure 9:
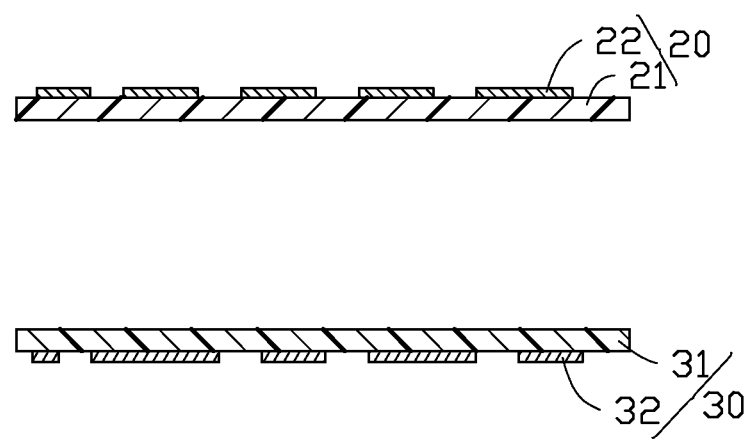

FIG. 9 illustrates that a first built-up structure 20 and a second built-up structure 30 are provided. The first and second built-up structures 20 and 30 correspond to the laminated area 12 respectively. The first built-up structure 20 includes a second dielectric layer 21 and a second conductive pattern 22. The second conductive pattern 22 is located at a side of the dielectric layer 21. The second built-up structure 30 includes a third dielectric layer 31 and a third conductive pattern 32. The third conductive pattern 32 is located at a side of the third dielectric layer 31.

Figure 10:
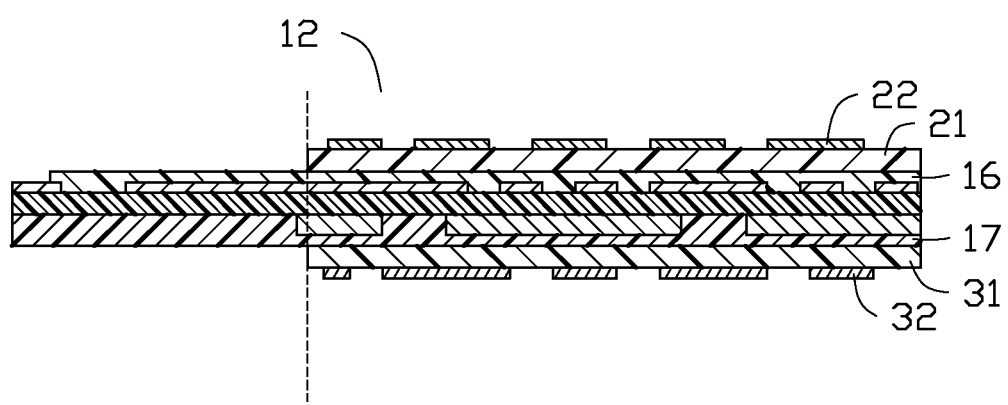

FIG. 10 illustrates that the first and second built-up structures 20 and 30 are laminated on the first and second cover layers 16 and 17 respectively. The second dielectric layer 21 is located between the first cover layer 16 and the second conductive pattern 22. The third dielectric layer 31 is located between the second cover layer 17 and the third conductive pattern 32.

Figure 11:
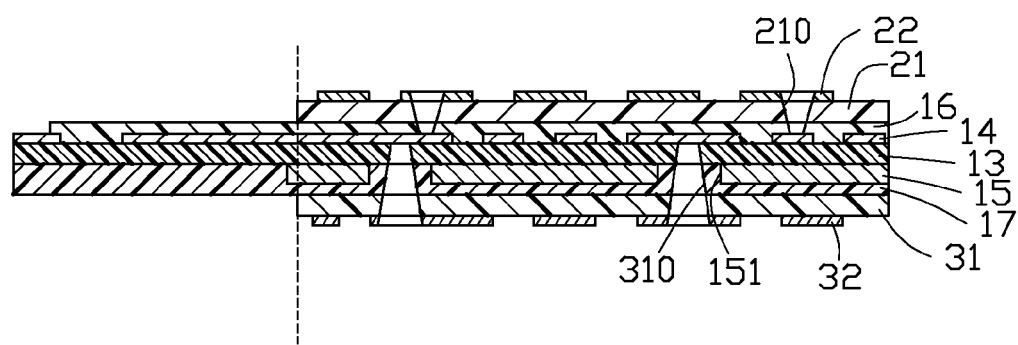

FIG. 11 illustrates that a plurality of first and second blind holes 210 and 310 are defined. The first blind holes 210 run through the second conductive pattern 22, the second dielectric layer 21, and the first cover layer 16. A portion of the first conductive pattern 14 is exposed from the first blind holes 210. The second blind holes 310 correspond to the first openings 151 respectively. The second blind holes 310 run through the third conductive pattern 32, the third dielectric layer 31, the second cover layer 17, the first openings 151, and the first dielectric layer 13. A portion of the first conductive pattern 14 is exposed from the second blind holes 310.

FIG. 8 illustrates that a plurality of first and second conductive holes 211 and 311 are formed by plating and filling the first and second blind holes 210 and 310 with conductive materials such as copper or silver.

Figure 12:
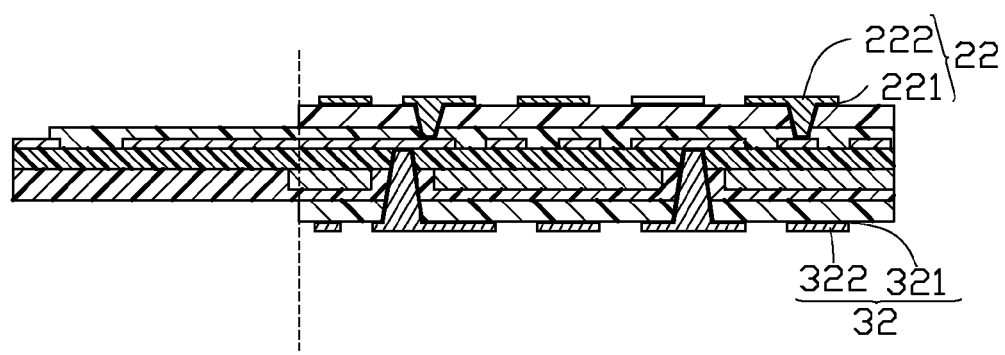

In another embodiment, FIG. 12 illustrates that the second conductive pattern 22 includes a first seed layer 221 and a first plated layer 222. The third conductive pattern 32 includes a second seed layer 321 and a second plated layer 322. In that case, the second dielectric layer 21, the second conductive pattern 22, the third dielectric layer 31, and the third conductive pattern 32 can be obtained in following way.

Figure 13:
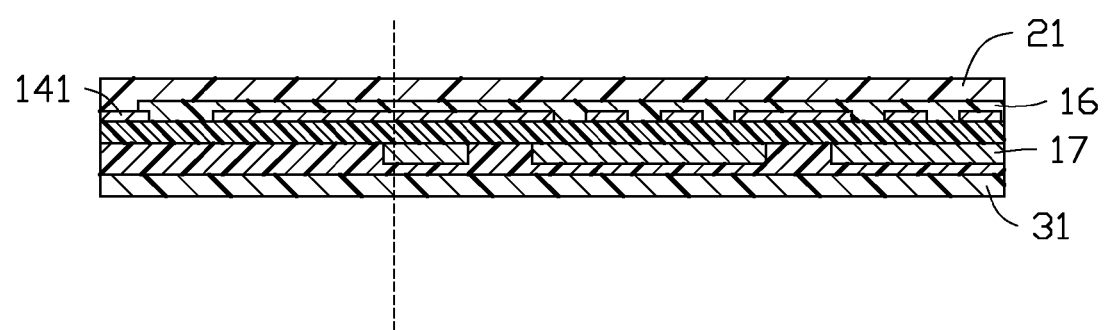

FIG. 13 illustrates that a second dielectric layer 21 is laminated on the first cover layer 16. A third dielectric layer 31 is laminated on the second cover layer 17. The second dielectric layer 21 covers the first cover layer 16 and the connection terminal 141 exposed from an end of the first cover layer 16. The third dielectric layer 31 covers the second cover layer 17.

Figure 14:
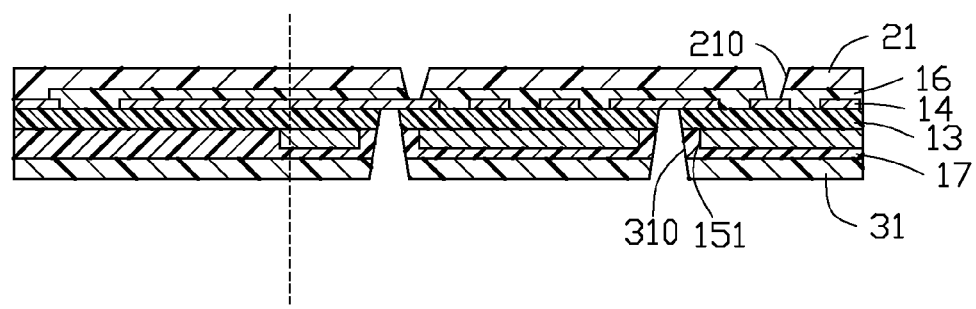

FIG. 14 illustrates that a plurality of first and second blind holes 210 and 310 are defined. The first blind holes 210 run through the second dielectric layer 21 and the first cover layer 16. A portion of the first conductive pattern 14 is exposed from the first blind holes 210. The second blind holes 310 run through the third dielectric layer 31, the second cover layer 17 and the first dielectric layer 13. The second blind holes 310 correspond to the first openings 151 respectively. The second blind holes 310 are separated from the bearing layer 15 by the second cover layer 17. A portion of the first conductive pattern 14 is exposed from the second blind holes 310.

Figure 15:
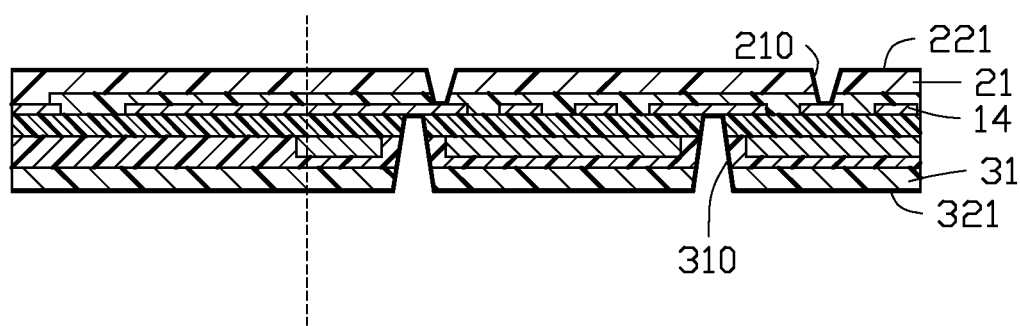

FIG. 15 illustrates that a first seed layer 221 and a second seed layer 321 are formed. The first seed layer 221 covers the second dielectric layer 21, walls of the first blind holes 210, and the first conductive pattern 14 exposed from the first blind holes 210. The second seed layer 321 covers the third dielectric layer 31, walls of the second blind holes 310, and the first conductive pattern 14 exposed from the second blind holes 310.

Figure 16:
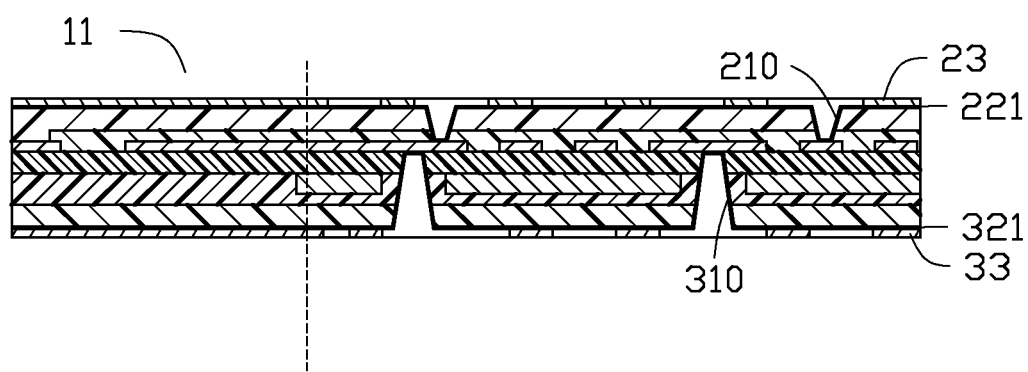

FIG. 16 illustrates that a first patterned barrier layer 23 and a second patterned barrier layer 33 are formed. The first patterned barrier layer 23 is formed on the first seed layer 221. The first patterned barrier layer 23 entirely covers the first seed layer 221 corresponding to the bent area 11. A portion of the first seed layer 221 is exposed from the first barrier layer 23. The first blind holes 210 are exposed from the first patterned barrier layer 23. The second patterned barrier layer 33 entirely covers the second seed layer 321 corresponding to the bent area 11. A portion of The second blind holes 310 are exposed from the second patterned barrier layer 33.

Figure 17:
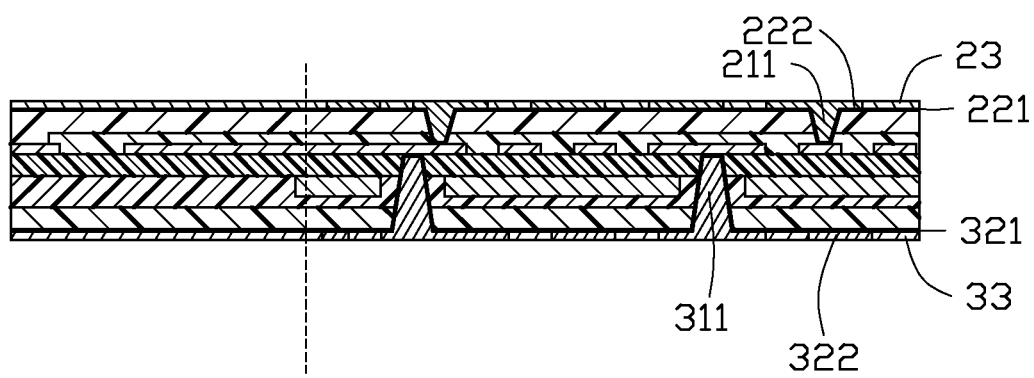

FIG. 17 illustrates that a first plated layer 222 and a second plated layer 322 are formed. The first plated layer 222 is formed on the exposed first seed layer 221 and filled in the first blind holes 210 defining a plurality of first conductive holes 211. The second plated layer 322 is formed on the exposed second seed layer 321 and filled in the second blind holes 310 defining a plurality of second conductive holes 311.

Figure 18:
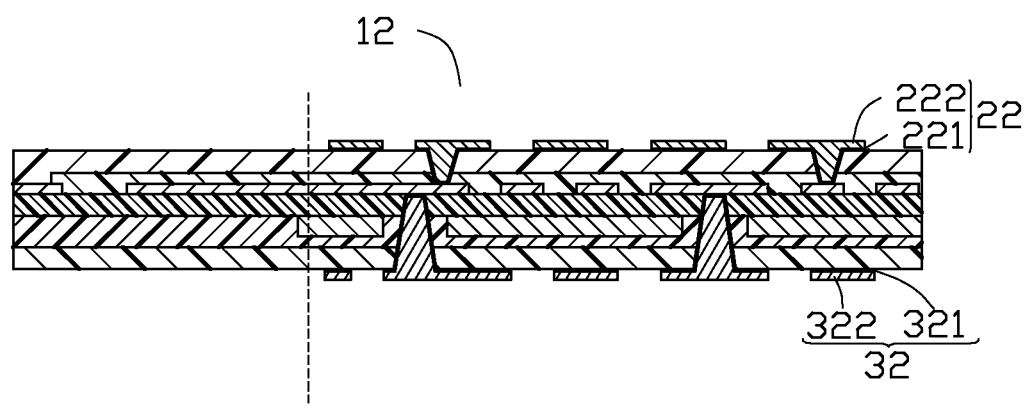

FIG. 18 illustrates that the first barrier layer 23, the first seed layer 221 covered by the first barrier layer 23, the second barrier layer 33, and the second seed layer 321 covered by the second barrier layer 33 are removed to form a second conductive pattern 22 and a third conductive pattern 32 respectively. Both of the second and third conductive patterns 22 and 32 correspond to the laminated area 12. A portion of the second and third dielectric layers 21 and 31 are exposed from the second and third conductive pattern 22 and 32.

FIG. 12 illustrates that the second dielectric layer 21, the first cover layer 16, the third dielectric layer 31, and the third cover layer 17 corresponding to the bent area 11 are removed by means of routing or laser cutting.

At block 404, forming a first solder resist layer 40 and a second solder resist layer 50.

Figure 19:
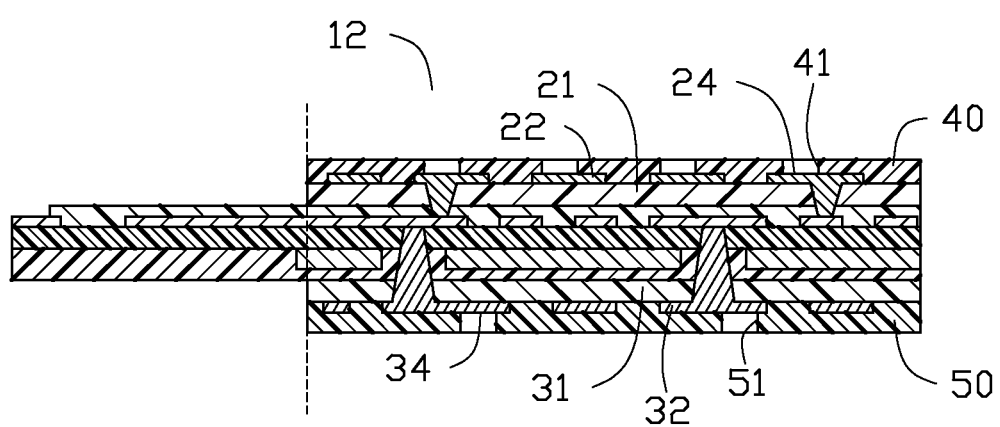

FIG. 19 illustrates that the first solder resist layer 40 is formed on the second conductive pattern 22. The first solder resist layer 40 corresponds to the laminated area 12. The first solder resist layer 40 covers the second conductive pattern 22 and the second dielectric layer 21 exposed from the second conductive pattern 22. A plurality of third openings 41 are defined in the first solder resist layer 40. A portion of the second conductive pattern 22 is exposed from the third openings 41 defining a plurality of first pads 24. The first pads 34 are configured to electrically connect with a chip 60. The second solder resist layer 50 is formed on the third conductive pattern 32. The second solder resist layer 50 corresponds to the laminated area 12. The second solder resist layer 50 covers the third conductive pattern 32 and the third dielectric layer 31 exposed from the third conductive pattern 32. A plurality of fourth openings 51 are defined in the second solder resist layer 50. A portion of the third conductive pattern 32 is exposed from the fourth openings 51 defining a plurality of second pads 34. The second pads 34 are configured to electrically connect with a second external device 300.

At block 405, mounting a chip 60 on the second conductive pattern 22.

Figure 20:
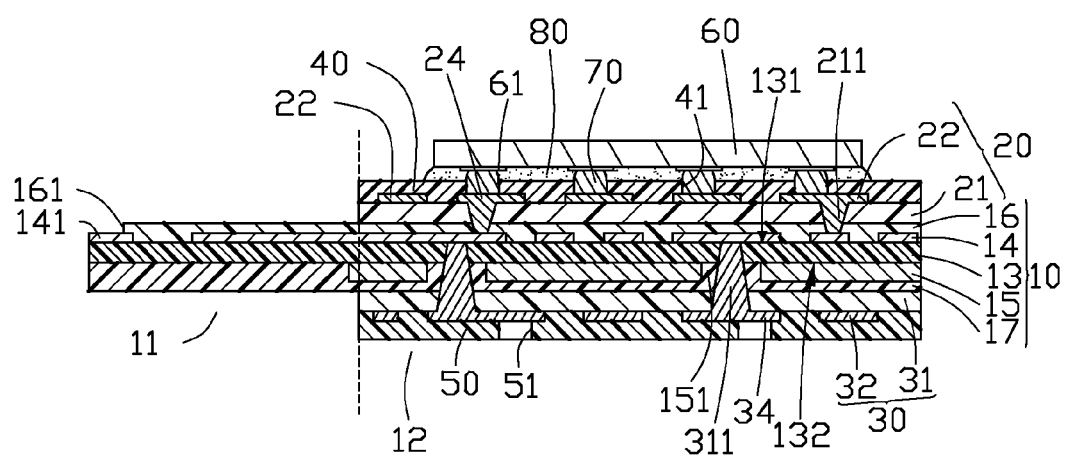

The chip 60 can be a logic chip or a memory chip. FIG. 20 illustrates that the chip 60 includes a plurality of electrode pads 61. Each electrode pad 61 corresponds to a first pad 24. Each electrode pad 61 and a corresponding first pad 24 are electrically connected with each other by a solder ball 70. In at least one embodiment, there is bottom resin 80 filled in the space between the chip 60, the first solder resist layer 40, and the solder balls 70.

In at least one embodiment, the method for mounting the chip 60 can be as follows.

A solder ball 70 is formed on each first pad 24. The solder balls 70 are protruding from the first solder resist layer 40.

A chip 60, including a plurality of electrode pads 61, is mounted on the second conductive pattern 22. The electrode pads 61 correspond to the solder balls 70. Each electrode pad 61 is electrically connected to a corresponding solder ball 70.

Bottom resin 80 is filled in a space between the chip 60, the second conductive pattern 22, and the solder balls 70.

In other embodiments, before that the first and second solder resist layers 40 and 50 are formed, more dielectric layers and conductive patterns can be formed on the second and third conductive patterns 22 and 32. Each dielectric layer defines a plurality of conductive holes. Each conductive pattern electrically connects to the second or third conductive pattern 22 or 32 via the conductive holes.

Figure 21:
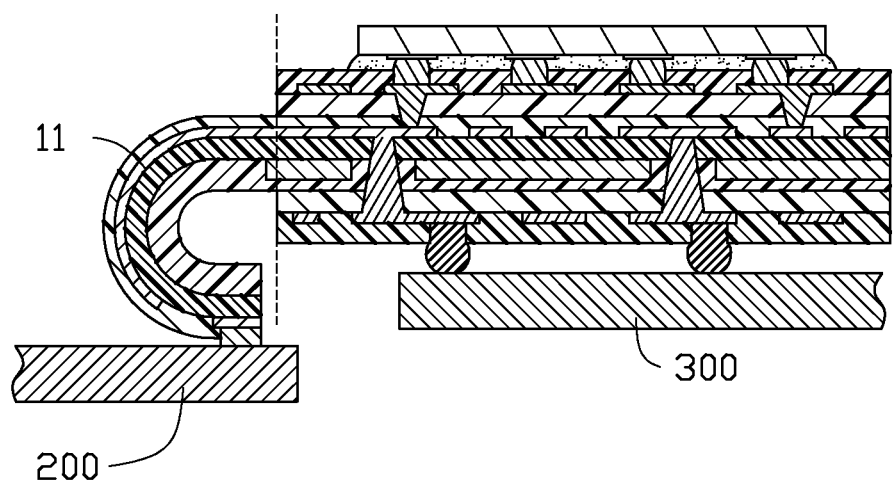
FIG. 21 is a cross-sectional view of a use state of the package structure of FIG. 20.

FIGS. 20 and 21 illustrate an exemplary embodiment of a package structure 100. The package structure 100 includes a flexible circuit board 10, a first built-up structure 20, a second built-up structure 30, a first solder resist layer 40, and a second resist layer 50.

In at least one embodiment, the flexible circuit board 10 defines a bent area 11 and a laminated area 12 connected with the bent area 11.

The flexible circuit board 10 includes a first dielectric layer 13, a first conductive pattern 14, and a bearing layer 15. The first dielectric layer 13 includes a first surface 131 and a second surface 132. The first and second surfaces 131 and 132 are opposite and substantially parallel to each other. The first conductive pattern 14 is located on the first surface 131. The first conductive pattern 14 extends from the laminated area 12 to the bent area 11. The first conductive pattern 14 includes a connection terminal 141. The connection terminal 141 is located at an end of the beading area 11 away from the laminated area 12. The connection terminal 141 is configured to electrically connect to a first external device 200. The bearing layer 15 is located on the second surface 132. The bearing layer 15 corresponds to the laminated area 12. A thickness of the bearing layer 15 is greater than that of the first conductive pattern 14. The bearing layer 15 is configured to provide a rigid support. The bearing layer 15 defines a plurality of first openings 151. A portion of the first dielectric layer 13 is exposed from the first openings 151.

The flexible circuit board 10 further includes a first cover layer 16 and a second cover layer 17. The first cover layer 16 covers the first conductive pattern 14 and the first dielectric layer 13 exposed from the first conductive pattern 14. The first cover layer 16 defines a plurality of second openings 161. The connection terminal 141 is exposed from the second openings 161. The second cover layer 17 covers the bearing layer 15, the first dielectric layer 13 exposed from the first openings 151, and the dielectric layer 13 corresponding to the bent area 11.

The first built-up structure 20 is located on the first cover layer 16, and corresponds to the laminated area 12. The first built-up structure 20 includes a second dielectric layer 21 and a second conductive pattern 22. The second dielectric layer 21 can be made of flexible insulating materials such as polyimide and polyester, or be made of rigid insulating materials such as phenol-formaldehyde resin, epoxy resin, and fiber glass fabric. A plurality of first conductive holes 211 are defined in the second dielectric layer 21. The first conductive holes 211 run through the second dielectric layer 21 and the first cover layer 16. The second conductive pattern 22 and the first conductive pattern 14 are electrically connected with each other via the first conductive holes 211.

The second built-up structure 30 is located on the second cover layer 17 and corresponds to the laminated area 12. The second built-up structure 30 includes a third dielectric layer 31 and a third conductive pattern 32. The third dielectric layer 31 can be made of flexible insulating materials such as polyimide and polyester, or be made of rigid insulating materials such as phenol-formaldehyde resin, epoxy resin, and fiber glass fabric. A plurality of second conductive holes 311 are defined in the third dielectric layer 31. The second conductive holes 311 run through the third dielectric layer 31, the second cover layer 17, and the first dielectric layer 13. The second conductive holes 311 correspond to the first openings 151 respectively. The second conductive holes 311 and the bearing layer 15 are separated from each other. The third conductive pattern 32 and the first conductive pattern 14 are electrically connected with each other via the second conductive holes 311.

The first solder resist layer 40 covers on the second conductive pattern 22. The first solder resist layer 40 defines a plurality of third openings 41. A portion of the second conductive pattern 22 is exposed from the third openings 41 defining a plurality of first pads 24. The first pads 24 are configured to electrically connect to a chip 60.

The second solder resist layer 50 covers on the third conductive pattern 32. The second solder resist layer 50 defines a plurality of fourth openings 51. A portion of the third conductive pattern 32 is exposed from the fourth openings 51 and defines a plurality of second pads 34. The second pads 34 are configured to electrically connect to a second external device 300.

The package structure 100 further includes a chip 60. The chip 60 is mounted on the first solder resist layer 40. The chip 60 includes a plurality of electrode pads 61. The electrode pads 61 correspond to the first pads 24 respectively. Each electrode pad 61 and a corresponding first pad 24 are electrically connected with each other via a solder ball 70. Bottom resin 80 is filled in a space between the chip 60, the first solder resist layer 40, and the solder balls 80.

In other embodiments, the package structure 100 can further include more built-up structures. The built-up structures are located between the second conductive pattern 22 and the first solder resist layer 40, or between the third conductive pattern 32 and the second solder resist layer 50. Each built-up structure includes a conductive pattern and a dielectric layer. Each conductive pattern is electrically connected with each other via conductive holes defined in each dielectric layer.

The embodiments shown and described above are only examples. Many details are often found in the art such as the other features of a package structure and a method for manufacturing a package structure. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for manufacturing a package structure comprising:
providing a flexible circuit board defining a bent area and a laminated area and comprising a first dielectric layer, a first conductive pattern, and a bearing layer, wherein the first conductive pattern and the bearing layer are located at opposite sides of the first dielectric layer, the first conductive pattern comprises a connection terminal located at an end of the bent area away from the laminated area, the bearing layer corresponds to portions of the laminated area;
forming a second dielectric layer and a second conductive pattern on the first conductive pattern, and forming a third dielectric layer and a third conductive pattern on the bearing layer, wherein a plurality of first conductive holes are defined in the second dielectric layer, the second conductive pattern and the first conductive pattern are electrically connected with each other via the first conductive holes, a plurality of second conductive holes are defined in the third dielectric layer, the second conductive holes are separated from the bearing layer, the third conductive pattern and the first conductive pattern electrically connected with each other via the second conductive holes, wherein the second dielectric layer, the third dielectric layer, the second conductive pattern, and the third conductive pattern correspond only to the laminated area; and
forming a first solder resist layer on the second conductive pattern, wherein the first solder resist layer defines a plurality of openings, a portion of the second conductive pattern is exposed from the openings defining a plurality of first pads.

2. The method for manufacturing a package structure of claim 1, further comprising forming a second solder resist layer on the third conductive pattern, wherein the second solder resist layer defines a plurality of openings, and a portion of the third conductive pattern is exposed from the openings defined by the second solder resist layer, thereby defining a plurality of second pads.

3. The method for manufacturing a package structure of claim 1, further comprising mounting a chip on the first solder resist layer, wherein the chip comprises a plurality of electrode pads, and each electrode pad corresponds to and electrically connects with one of the plurality of first pads.

4. The method for manufacturing a package structure of claim 1, before forming a second dielectric layer and a second conductive pattern on the first conductive pattern, and forming a third dielectric layer and a third conductive pattern on the bearing layer, further comprising forming a first cover layer on the first conductive pattern and forming a second cover layer on the bearing layer, wherein the first cover layer defines a plurality of openings, the connection terminal is exposed from the openings, the second cover layer covers the bearing layer and the first dielectric layer corresponding to the bent area.

5. The method for manufacturing a package structure of claim 1, wherein the flexible circuit board is obtained in following way:
a flexible substrate is provided, the flexible substrate defines the bent area and the laminated area, the flexible substrate comprises the first dielectric layer, a first copper layer, and an original bearing layer, the first copper layer and the original bearing layer are located at opposite sides of the first dielectric layer;
the first copper layer is selectively removed to form the first conductive pattern, the first conductive pattern comprises the connection terminal located at the end of the bent area away from the laminated area, the original bearing layer is selectively removed to form the bearing layer, the bearing layer corresponds to the laminated area.

6. The method for manufacturing a package structure of claim 1, wherein the flexible circuit board is obtained in following way:
a flexible substrate is provided, the flexible substrate defines the bent area and the laminated area, the flexible substrate comprises the first dielectric layer and a first copper layer, the first copper layer is located at a side of the first dielectric layer;
a first conductive pattern is formed by selectively removing the first copper layer, the first conductive pattern comprises the connection terminal, the connection terminal is located at the end of the bent area away from the laminated area;
the bearing layer is provided, the bearing layer corresponds to the laminated area; and
the bearing layer is laminated on a side of the first dielectric layer opposite to the first conductive pattern, the bearing layer is located in the laminated area.

7. The method for manufacturing a package structure of claim 1, wherein the method for forming the second dielectric layer and the second conductive pattern on the first conductive pattern, and forming the third dielectric layer and the third conductive pattern on the bearing layer is as follows:
a first built-up structure and a second built-up structure corresponding to the laminated area are provided, the first built-up structure comprises the second dielectric layer and the second conductive pattern, the second built-up structure comprises the third dielectric layer and the third conductive pattern;
the first and second built-up structures are laminated on the first conductive pattern and the bearing layer respectively, the second dielectric layer is located between the first conductive pattern and the second conductive pattern, the third dielectric layer is located between the bearing layer and the third conductive pattern;
a plurality of first and second blind holes are defined, the first blind holes run through the second conductive pattern and the second dielectric layer, a portion of the first conductive pattern is exposed from the first blind holes, the second blind holes run through the third conductive pattern, the third dielectric layer, the bearing layer, and the first dielectric layer, a portion of the first conductive pattern is exposed from the second blind holes; and
a plurality of first and second conductive holes are formed by means of plating and filling the first and second blind holes with conductive material, the first and second conductive patterns are electrically connected with each other via the first conductive holes, the first and third conductive patterns are electrically connected with each other via the second conductive holes.

8. The method for manufacturing a package structure of claim 1, wherein the method for forming the second dielectric layer and the second conductive pattern on the first conductive pattern, and forming the third dielectric layer and the third conductive pattern on the bearing layer is as follows:
the second dielectric layer is laminated on the first conductive pattern, the third dielectric layer is laminated on the bearing layer, the second dielectric layer covers the first conductive pattern and the first dielectric layer exposed from the first conductive pattern, the third dielectric layer covers the bearing layer, the first dielectric layer exposed from the bearing layer, and the first dielectric layer corresponding the bent area;
a plurality of first and second blind holes are defined, the first blind holes run through the second dielectric layer and up to a surface of the first conductive pattern, then a portion of the first conductive pattern is exposed to form the first blind holes, the second blind holes run through the third dielectric layer, the bearing layer, and the first dielectric layer and up to another surface of the first conductive pattern, then a portion of the first conductive pattern is exposed to form the second blind holes;
a first seed layer and a second seed layer are formed, the first seed layer covers the second dielectric layer, walls of the first blind holes, and the first conductive pattern exposed from the first blind holes, the second seed layer covers the third dielectric layer, walls of the second blind holes, and the first conductive pattern exposed from the second blind holes;
a first patterned barrier layer and a second patterned barrier layer are formed, the first patterned barrier layer covers on the first seed layer, a portion of the first seed layer and the first blind holes are exposed from the first patterned barrier layer, the second patterned barrier layer covers on the second seed layer, a portion of the second seed layer and the second blind holes are exposed from the second patterned barrier layer;
a first plated layer and a second plated layer are formed, the first plated layer is formed on the portion of the first seed layer exposed from the first patterned barrier layer—and filled in the first blind holes defining the plurality of first conductive holes, the second plated layer is formed on the portion of the second seed layer exposed from the second patterned barrier layer and filled in the second blind holes defining the plurality of second conductive holes;
the first barrier layer, the first seed layer covered by the first barrier layer, the second barrier layer, and the second seed layer covered by the second barrier layer are removed to form a second conductive pattern and a third conductive pattern respectively; and the second dielectric layer and the third dielectric layer corresponding to the bent area are removed.

* * * * *